(12) United States Patent
Choi

(10) Patent No.: US 11,600,600 B2
(45) Date of Patent: Mar. 7, 2023

(54) SEMICONDUCTOR PACKAGE INCLUDING STACKED SEMICONDUCTOR CHIPS

(71) Applicant: SK hynix Inc., Icheon-si (KR)

(72) Inventor: Bok Kyu Choi, Icheon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 122 days.

(21) Appl. No.: 17/308,710

(22) Filed: May 5, 2021

(65) Prior Publication Data

US 2022/0254756 A1 Aug. 11, 2022

(30) Foreign Application Priority Data

Feb. 8, 2021 (KR) .................. 10-2021-0017839

(51) Int. Cl.
*H01L 27/105* (2006.01)
*H01L 25/065* (2006.01)

(52) U.S. Cl.
CPC ...... *H01L 25/0657* (2013.01); *H01L 27/1052* (2013.01); *H01L 2225/06506* (2013.01)

(58) Field of Classification Search
CPC ............. H01L 25/0657; H01L 27/1052; H01L 2225/06506
See application file for complete search history.

(56) References Cited

U.S. PATENT DOCUMENTS 9,935,076 B1 4/2018 Ramachandran et al.

OTHER PUBLICATIONS

"How the step-down switching regulator works," Power Supply Design Technical Information Site TechWeb, Nov. 22, 2018, pp. 1-3, https://techweb.rohm.co.kr/knowledge/dcdc/s-dcdc/02-s-dcdc/90.

Adam Castaldo, "Switching regulator fundamentals," Application Report SNVA559C, Sep. 2012, pp. 1-28, Texas Instruments Incorporated, Dallas, Texas.

Alan Roth et al., "Heterogeneous Power Delivery for 7nm High Performance Chiplet-Based Processors Using Integrated Passive Device and In-Package Voltage Regulator," JFS5.5, 2020 Symposia on VLSI Technology and Circuits.

(Continued)

*Primary Examiner* — Timor Karimy
(74) *Attorney, Agent, or Firm* — William Park & Associates Ltd.

(57) ABSTRACT

A semiconductor package includes: a first semiconductor chip stack including a plurality of first semiconductor chips which are stacked in a vertical direction; a bridge die stack disposed to be spaced apart from the first semiconductor chip stack in a horizontal direction and including a plurality of bridge dies which are stacked in the vertical direction, wherein the bridge dies include through electrodes, respectively, and the through electrodes aligned in the vertical direction are connected to each other through a connection electrode between the bridge dies; a redistribution layer disposed over the first semiconductor chip stack and the bridge die stack; a second semiconductor chip disposed over the redistribution layer and configured to receive a voltage through the through electrodes aligned in the vertical direction, the connection electrode, and the redistribution layer; and a voltage regulator configured to adjust the voltage.

20 Claims, 7 Drawing Sheets

(56) References Cited

OTHER PUBLICATIONS

Alan Roth et al., "Heterogeneous Power Delivery for 7nm High-Performance Chiplet-Based Processors Using Integrated Passive Device and In-Package Voltage Regulator," 2020 IEEE Symposium on VLSI Technology, Jun. 16-19, 2020, Honolulu, HI, USA.

Linear and Switching Voltage Regulator Fundamental Part 1, Literature No. SNVA558, Texas Instruments Incorporated, 2011, Dallas, Texas, https://www.ti.com/lit/an/snva558/snva558.pdf?ts=1620268489577&ref_url=https%253A%252F%252Fwww.google.com%252F.

Yun Seop Yu, "Voltage Regulators"; Electrical, Electronic and control Engineering, Chapter 17, Hankyong National University.

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2021-0017839 filed on Feb. 8, 2021, which is incorporated herein by reference in its entirety.

BACKGROUND

1. Technical Field

This patent document relates to a semiconductor package, and more particularly, to a semiconductor package in which a plurality of semiconductor chips are stacked in a vertical direction.

2. Related Art

Electronic products require multifunctional and high-volume data processing while their sizes are getting smaller. Accordingly, there is a growing need to increase the degree of integration of semiconductor devices used in such electronic products.

However, due to the limitation of semiconductor integration technology, it is difficult to satisfy a required function with only a single semiconductor chip, and thus a semiconductor package in which a plurality of semiconductor chips are embedded has been manufactured.

SUMMARY

In an embodiment, a semiconductor package may include: a first semiconductor chip stack including a plurality of first semiconductor chips which are stacked in a vertical direction; a bridge die stack disposed to be spaced apart from the first semiconductor chip stack in a horizontal direction and including a plurality of bridge dies which are stacked in the vertical direction, wherein the bridge dies include through electrodes, respectively, and the through electrodes aligned in the vertical direction are connected to each other through a connection electrode between the bridge dies; a redistribution layer disposed over the first semiconductor chip stack and the bridge die stack; a second semiconductor chip disposed over the redistribution layer and configured to receive a voltage through the through electrodes aligned in the vertical direction, the connection electrode, and the redistribution layer; and a voltage regulator configured to adjust the voltage.

In another embodiment, a semiconductor package may include: a first semiconductor chip stack including a plurality of first semiconductor chips which are stacked in a vertical direction; a bridge die stack disposed to be spaced apart from the first semiconductor chip stack in a horizontal direction and including a plurality of bridge dies which are stacked in the vertical direction; a redistribution layer disposed over the first semiconductor chip stack and the bridge die stack; a second semiconductor chip disposed over the redistribution layer and configured to receive a voltage through the bridge die stack and the redistribution layer; and a voltage regulator configured to adjust the voltage and includes a switch, a diode, and a capacitor included in at least one of the bridge dies, an inductor included in the redistribution layer, and a controller included in the second semiconductor chip.

DETAILED DESCRIPTION

Figure 1:
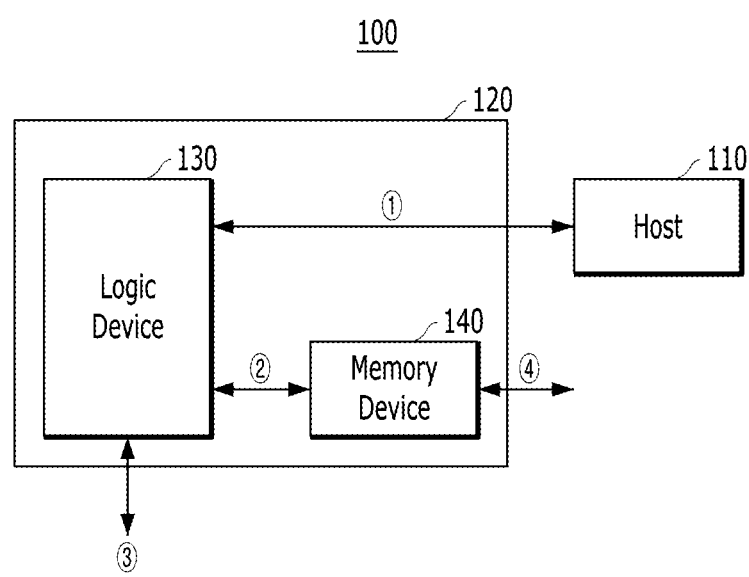
FIG. 1 is a view schematically illustrating an example of a data processing system including a memory system according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. It will be understood that although the terms first, second, third etc. may be used herein to describe various elements, these elements should not be limited by these terms. These terms are only used to distinguish one element from another element, but not used to define only the element itself or to mean a particular sequence.

FIG. 1 is a view schematically illustrating an example of a data processing system including a memory system according to an embodiment of the present disclosure.

Referring to FIG. 1, a data processing system 100 may include a host 110 and a memory system 120.

The host 110 may include various wired and/or wireless electronic devices such as a mobile phone, an MP3 player, a laptop computer, a desktop computer, a game console, a TV, a projector, or the like. In addition, the host 110 may include at least one operating system (OS). This operating system may manage and control the functions and operations of the host 110 generally, and may be executed in response to a request of a user using the data processing system 100 or the memory system 120.

The memory system 120 may execute various operations in response to a request from the host 110. In particular, the memory system 120 may store data accessed by the host 110. That is, the memory system 120 may be used as a main memory device or an auxiliary memory device of the host 110.

The memory system 120 may include a memory device 140 that stores data and a logic device 130 that controls an operation of the memory device 140.

The memory device 140 may store data accessed by the host 110, and may include volatile memory such as dynamic random access memory (DRAM) or static random access memory (SRAM), nonvolatile memory such as NAND flash, resistive random access memory (RRAM), phase-change random access memory (PRAM), magneto-resistive random access memory (MRAM), or ferroelectric random access memory (FRAM), or a combination thereof.

The logic device 130 may control the memory device 140 in response to a request from the host 110. As an example, the logic device 130 may provide data read from the memory device 140 to the host 110 or may store data provided from the host 110 in the memory device 140. The logic device 130 may include a central processing unit (CPU), a controller, an application specific integrated circuit (ASIC), an application processor (AP), or the like. Although not shown, the logic device 130 may include various units required for its operation such as an interface unit for interfacing with the host 110 and the memory device 140, a processor that controls the overall operation of the memory system 120, a power management unit that receives and manages power required for the logic device 130, or the like.

Meanwhile, in order for the logic device 130 to perform an operation such as receiving a command from the host 110 or transferring data to the host 110, a signal transmission path between the login device 130 and the host 110 may be required. This signal transmission path is indicated by arrow ①.

In addition, in order for the logic device 130 to access the memory device 140 under the control of the processor and perform read/write/erase operations, a signal transmission path between the logic device 130 and the memory device 140 may be required. This signal transmission path is indicated by arrow ②.

In addition, in order for the logic device 130 to operate, power may be required. This power may include various levels of power voltages or a ground voltage required for the logic device 130. Accordingly, a power supply path between the logic device 130 and an external device (not shown) that supplies power may be required. This power supply path is indicated by arrow ③.

In addition, in order for the memory device 140 to operate, power may be required. This power may include various levels of power voltages or a ground voltage required for the memory device 140. Accordingly, a power supply path between the memory device 140 and an external device (not shown) that supplies power may be required. This power supply path is indicated by an arrow ④.

In the data processing system 100 described above, the memory device 140 may be implemented as one or more memory chips, and the logic device 130 may be implemented as one or more logic chips. Furthermore, the memory system 120 including the memory device 140 and the logic device 130 may be implemented in one package. That is, the memory system 120 may be implemented as a system in package (SIP) in which a memory chip and a logic chip are integrated in one package. This will be described later with reference to FIG. 2.

Figure 2:
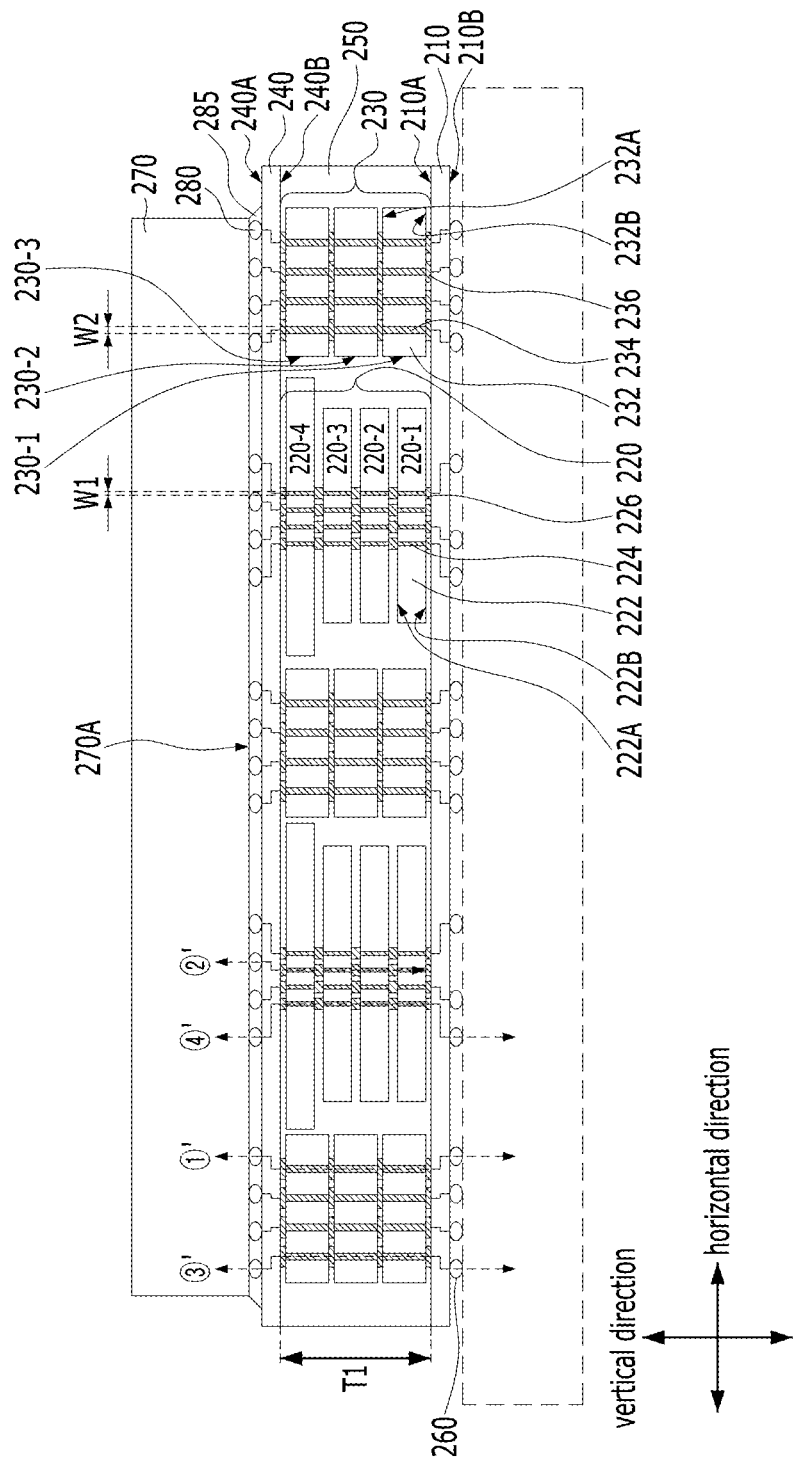
FIG. 2 is a cross-sectional view illustrating a semiconductor package according to an embodiment of the present disclosure.

FIG. 2 is a cross-sectional view illustrating a semiconductor package according to an embodiment of the present disclosure.

Referring to FIG. 2, the semiconductor package of the present embodiment may include a first redistribution layer 210, a first semiconductor chip stack 220, a bridge die stack 230, a second redistribution layer 240, a molding layer 250, a first external connection electrode 260, a second semiconductor chip 270, and a second external connection electrode 280.

The first redistribution layer 210 may include one surface 210A for arranging the first semiconductor chip stack 220 and the bridge die stack 230, and the other surface 210B for arranging a first external connection electrode 260 while located opposite to the one surface 210A. The first redistribution layer 210 may be for electrical connection between the first semiconductor chip stack 220 and the bridge die stack 230, and the first external connection electrode 260, and may have a wiring structure therefor. In this figure, the wiring structure of the first redistribution layer 210 is schematically illustrated by lines.

Meanwhile, instead of the first redistribution layer 210 of the present embodiment, various structures having a wiring structure for electrical connection with the first external connection electrode 260 while supporting the first semiconductor chip stack 220 and the bridge die stack 230, for example, a substrate such as a printed circuit board (PCB), may be used.

The first semiconductor chip stack 220 may be disposed over the one surface 210A of the first redistribution layer 210. The first semiconductor chip stack 220 may include a plurality of first semiconductor chips 220-1, 220-2, 220-3, and 220-4 which are stacked in a vertical direction, and a first connection electrode 226 connecting the first semiconductor chips 220-1, 220-2, 220-3, and 220-4 therebetween. In the present embodiment, four first semiconductor chips 220-1, 220-2, 220-3, and 220-4 are stacked, but the present disclosure is not limited thereto, and the number of first semiconductor chips stacked in the vertical direction may be variously modified.

Each of the plurality of first semiconductor chips 220-1, 220-2, 220-3, and 220-4 may include a first body portion 222 and a first through electrode 224.

The first body portion 222 may have one surface 222A facing the second redistribution layer 240 and the other surface 222B facing the first redistribution layer 210 by being located opposite to the one surface 222A. In addition, although not shown, the first body portion 222 may include a semiconductor body such as a silicon body, and a wiring portion formed in the semiconductor body and implementing various integrated circuits. The wiring portion may be disposed adjacent to the one surface 222A of the first body portion 222 or may be disposed adjacent to the other surface 222B of the first body portion 222. The wiring portion may be variously implemented according to the type of the first semiconductor chips 220-1, 220-2, 220-3, and 220-4. For example, when the first semiconductor chips 220-1, 220-2, 220-3, and 220-4 are memory chips, the wiring portion may include a memory cell array including a plurality of memory cells. The first semiconductor chips 220-1, 220-2, 220-3, and 220-4 may include volatile memory such as DRAM (Dynamic Random Access Memory) or SRAM (Static RAM), or nonvolatile memory such as NAND flash memory, RRAM (Resistive RAM), PRAM (Phase-change RAM), MRAM (Magneto-resistive RAM), or FRAM (Ferroelectric RAM). The first semiconductor chip stack 220 may substantially correspond to the memory device 140 of FIG. 1 described above.

The first through electrode 224 may extend in the vertical direction to pass through the first body portion 222, and may have a pillar shape. The first through electrode 224 may be electrically connected to the wiring portion of the first body portion 222. In each of the plurality of first semiconductor chips 220-1, 220-2, 220-3, and 220-4, a plurality of first through electrodes 224 may be arranged in a horizontal direction. When the first body portion 222 includes a silicon body, the first through electrode 224 may include a TSV (Through Silicon Via). The first through electrode 224 may include a metal such as copper (Cu), tin (Sn), silver (Ag), tungsten (W), nickel (Ni), ruthenium (Ru), or cobalt (Co), or a compound of this metal.

The first connection electrode 226 may be interposed between the plurality of first semiconductor chips 220-1, 220-2, 220-3, and 220-4 to electrically connect the first through electrodes 224 aligned in the vertical direction to each other. In this figure, in the vertical direction, one end of the first through electrode 224 may be exposed to be positioned at substantially the same level as the one surface 222A of the first body portion 222, and the other end of the first through electrode 224 may be exposed to be positioned at substantially the same level as the other surface 222B of the first body portion 222, and accordingly, one of the first connection electrodes 226 may directly contact the one end of the first through electrode 224 positioned thereunder and may directly contact the other end of the first through electrode 224 positioned thereon. However, the present disclosure is not limited thereto, and the first connection electrode 226 may be electrically connected to the first through electrode 224 through the wiring portion formed adjacent to the one surface 222A or the other surface 222B of the first body portion 222. In the horizontal direction, the arrangement of the first connection electrodes 226 may be substantially the same as the arrangement of the first through electrodes 224. In the present embodiment, the first connection electrode 226 is shown to have a pillar shape, but the present disclosure is not limited thereto, and the first connection electrode 226 may have various shapes such as a pillar shape, a ball shape, or a combination thereof. In addition, the first connection electrode 226 may include various metal materials, solder materials, or a combination thereof.

The first connection electrode 226 as described above may be further formed between the first redistribution layer 210 and the lowermost first semiconductor chip 220-1, and/or between the second redistribution layer 240 and the uppermost first semiconductor chip 220-4.

Accordingly, through the first through electrodes 224 and the first connection electrodes 226, electrical connection between the plurality of first semiconductor chips 220-1, 220-2, 220-3, and 220-4, electrical connection between the first redistribution layer 210 and the first semiconductor chip stack 220, and electrical connection between the first semiconductor chip stack 220 and the second redistribution layer 240 may be possible.

The bridge die stack 230 may be disposed over the one surface 210A of the first redistribution layer 210 to be spaced apart from the first semiconductor chip stack 220 in the horizontal direction. In the present embodiment, three bridge die stacks 230 and two first semiconductor chip stacks 220 are alternately arranged to be spaced apart from each other in the horizontal direction, but the present disclosure is not limited thereto, and the number and arrangement of the bridge die stack 230 and the first semiconductor chip stack 220 included in the semiconductor package of the present embodiment may be variously modified.

The bridge die stack 230 may include a plurality of bridge dies 230-1, 230-2, and 230-3 which are stacked in the vertical direction, and a second connection electrode 236 connecting them to each other. In the present embodiment, a case in which three bridge dies 230-1, 230-2, and 230-3 are stacked is illustrated, but the present disclosure is not limited thereto, and the number of bridge dies stacked in the vertical direction may be variously modified. Furthermore, the number of bridge dies included in the bridge die stack 230 may be independent of the number of first semiconductor chips included in the first semiconductor chip stack 220. As in the present embodiment, when the thickness of one of the bridge dies 230-1, 230-2, and 230-3 is greater than the thickness of one of the first semiconductor chips 220-1, 220-2, 220-3, and 220-4, the number of bridge dies may be smaller than the number of first semiconductor chips. However, the thickness of the bridge die stack 230 in the vertical direction may be substantially the same as the thickness of the first semiconductor chip stack 220 (see thickness T1).

Each of the plurality of bridge dies 230-1, 230-2, and 230-3 may include a second body portion 232 and a second through electrode 234.

The second body portion 232 may have one surface 232A facing the second redistribution layer 240 and the other surface 232B facing the first redistribution layer 210 by being located opposite to the one surface 232A. In addition, although not shown, the second body portion 232 may include a semiconductor body such as a silicon body, and a wiring portion formed in the semiconductor body and implementing various integrated circuits. The wiring portion may be disposed adjacent to the one surface 232A of the second body portion 232 or may be disposed adjacent to the other surface 232B of the second body portion 232. As will be described later, the plurality of bridge dies 230-1, 230-2, and 230-3 may include some of components of a voltage regulator. For example, the bridge dies 230-1, 230-2, and 230-3 may include a switch, a diode, a capacitor, or the like, necessary to implement a voltage regulator. This will be described later.

The second through electrode 234 may extend in the vertical direction to pass through the second body portion 232 and may have a pillar shape. The second through electrode 234 may be electrically connected to the wiring portion in the second body portion 232. In each of the plurality of bridge dies 230-1, 230-2, and 230-3, a plurality of second through electrodes 234 may be arranged in the horizontal direction. When the second body portion 232 includes a silicon body, the second through electrode 234 may include a TSV. The second through electrode 234 may include a metal such as copper (Cu), tin (Sn), silver (Ag), tungsten (W), nickel (Ni), ruthenium (Ru), cobalt (Co), or the like, or a compound of this metal.

A second connection electrode 236 may be interposed between the plurality of bridge dies 230-1, 230-2, and 230-3 to electrically connect the second through electrodes 234 aligned in the vertical direction to each other. In the present embodiment, in the vertical direction, one end of the second through electrode 234 may be exposed to be positioned at substantially the same level as the one surface 232A of the second body portion 232, and the other end of the second through electrode 234 may be exposed to be positioned at substantially the same level as the other surface 232B of the second body portion 232, and accordingly, one of the second connection electrodes 236 may directly contact the one end of the second through electrode 234 positioned thereunder and may directly contact the other end of the second through electrode 234 positioned thereon. However, the present disclosure is not limited thereto, and the second connection electrode 236 may be electrically connected to the second through electrode 234 through the wiring portion formed adjacent to the one surface 232A or the other surface 232B of the second body portion 232. In the horizontal direction, the arrangement of the second connection electrodes 236 may be substantially the same as the arrangement of the second through electrodes 234. In the present embodiment, the second connection electrode 236 is shown to have a pillar shape, but the present disclosure is not limited thereto, and the second connection electrode 236 may have various shapes such as a pillar shape, a ball shape, or a combination thereof. In addition, the second connection electrode 236 may include various metal materials, solder materials, or a combination thereof.

The second connection electrode 236 as described above may be further formed between the first redistribution layer 210 and the lowermost bridge die 230-1, and/or between the second redistribution layer 240 and the uppermost bridge die 230-3.

Accordingly, through the second through electrodes 234 and the second connection electrodes 236, electrical connection between the plurality of bridge dies 230-1, 230-2, and 230-3, electrical connection between the first redistribution layer 210 and the bridge die stack 230, and electrical connection between the bridge die stack 230 and the second redistribution layer 240 may be possible.

The second redistribution layer 240 may be disposed over the first semiconductor chip stack 220 and the bridge die stack 230. The second redistribution layer 240 may include one surface 240A for arranging the second external connection electrode 280 connected to the second semiconductor chip 270, and the other surface 240B facing the first semiconductor chip stack 220 and the bridge die stack 230 by being located opposite to the one surface 240A. The second redistribution layer 240 may be for electrical connection between the first semiconductor chip stack 220 and the bridge die stack 230, and the second external connection electrode 280, and may have a wiring structure therefor. In this figure, the wiring structure of the second redistribution layer 240 is schematically illustrated by lines. Furthermore, the second redistribution layer 240 may include other components for implementing the voltage regulator, for example, an inductor. This will be described later.

The molding layer 250 may be formed between the first redistribution layer 210 and the second redistribution layer 240 to surround the side surfaces of the first semiconductor chip stack 220 and the bridge die stack 230 to mold them. The molding layer 250 may include a molding material such as EMC (Epoxy Molding Compound). In the present embodiment, the molding layer 250 may fill spaces between the plurality of first semiconductor chips 220-1, 220-2, 220-3, and 220-4, between the lowermost first semiconductor chip 220-1 and the first redistribution layer 210, between the uppermost first semiconductor chip 220-4 and the second redistribution layer 240, between the plurality of bridge dies 230-1, 230-2, and 230-3, between the lowermost bridge die 230-1 and the first redistribution layer 210, and between the uppermost bridge die 230-3 and the second redistribution layer 240. Accordingly, the molding layer 250 may be formed to surround the side surfaces of the first electrodes 226 and the second connection electrodes 236 which are positioned in these spaces. However, the present disclosure is not limited thereto, and these spaces may be filled with another filling material (not shown) different from the molding layer 250.

The first external connection electrode 260 may be electrically connected to the first redistribution layer 210, and may serve to electrically connect the semiconductor package of the present embodiment to an external component (refer to the dotted rectangle). In the present embodiment, the first external connection electrode 260 is shown to have a ball shape, but the present disclosure is not limited thereto, and the first external connection electrode 260 may have various shapes such as a pillar shape, a ball shape, or a combination thereof.

The second semiconductor chip 270 may be disposed over the one surface 240A of the second redistribution layer 240. The second semiconductor chip 270 may be disposed such that its one surface 270A faces the one surface 240A of the second redistribution layer 240. When the first semiconductor chips 220-1, 220-2, 220-3, and 220-4 are memory chips, the second semiconductor chip 270 may include a logic circuit for controlling the memory chips. That is, the second semiconductor chip 270 may substantially correspond to the logic device 130 of FIG. 1 described above. Further, the second semiconductor chip 270 may include other components for implementing the voltage regulator, for example, a controller for on/off control of the switch of the voltage regulator. The components of the plurality of bridge dies 230-1, 230-2, and 230-3, the second redistribution layer 240, and the second semiconductor chip 270 may form the voltage regulator. This will be described later.

The second external connection electrode 280 may be interposed between the second semiconductor chip 270 and the second redistribution layer 240 to electrically connect them. In the present embodiment, the second external connection electrode 280 is shown to have a ball shape, but the present disclosure is not limited thereto, and the second external connection electrode 280 may have various shapes such as a pillar shape, a ball shape, or a combination thereof. In addition, the second external connection electrode 280 may include various metal materials, solder materials, or a combination thereof.

A space between the second semiconductor chip 270 and the second redistribution layer 240 may be filled with a filling material 285 such as an underfill. The filling material 285 may surround a side surface of the second external connection electrode 280.

Accordingly, a SIP in which the first semiconductor chip stack 220 functioning as a memory device and the second semiconductor chip 270 functioning as a logic device are integrated into one package may be implemented.

A signal transmission path and a power supply path in the semiconductor package of the present embodiment will be described as follows.

First, transmission of an external signal between the second semiconductor chip 270 and an external component of the semiconductor package (refer to the dotted rectangle)

may be performed through the first external connection electrode 260 for transmitting the external signal, the first redistribution layer 210, the stacked structure of the second connection electrodes 236 and second through electrodes 234 alternately arranged in the vertical direction, the second redistribution layer 240, and the second external connection electrode 280, as indicated by the dotted line ①'. When the second semiconductor chip 270 corresponds to the logic device 130 of FIG. 1 described above, such a signal transmission path as indicated by the dotted line ①' may correspond to the signal transmission path ① of FIG. 1.

Next, transmission of an internal signal between the second semiconductor chip 270 and the first semiconductor chip stack 220 may be performed through the stacked structure of the first through electrodes 224 and the first connection electrodes 226 alternately arranged in the vertical direction for transmitting the internal signal, the second redistribution layer 240, and the second external connection electrode 280, as indicated by the dotted line ②'. When the second semiconductor chip 270 and the first semiconductor chip stack 220 respectively correspond to the logic device 130 and the memory device 140 of FIG. 1, such a signal transmission path as indicated by the dotted line ②' may correspond to the signal transmission path ② of FIG. 1.

Next, power supply to the second semiconductor chip 270 from an external component (refer to the dotted rectangle) may be performed through the first external connection electrode 260 for supplying power required to the second semiconductor chip 270, the first redistribution layer 210, the stacked structure of the second connection electrodes 236 and the second through electrodes 234 alternately arranged in the vertical direction, the second redistribution layer 240, and the second external connection electrode 280, as indicated by a dotted line ③'. When the second semiconductor chip 270 corresponds to the logic device 130 of FIG. 1 described above, such a power supply path as indicated by a dotted line ③' may correspond to the power supply path ③ of FIG. 1.

Next, power supply to the first semiconductor chip stack 220 from an external component (refer to the dotted line) may be performed through the first external connection electrode 260 for supplying power required to the first semiconductor chip stack 220, the first redistribution layer 210, the stacked structure of the first connection electrodes 226 and the first through electrodes 224 alternately arranged in the vertical direction, the second redistribution layer 240, and the second external connection electrode 280, as indicated by a dotted line ④'. When the first semiconductor chip stack 220 corresponds to the memory device 140 of FIG. 1 described above, such a power supply path as indicated by a dotted line ④' may correspond to the power supply path ④ of FIG. 1.

According to the semiconductor package described above, the following effects may occur.

When the second semiconductor chip 270 is a logic chip, it includes a logic circuit that consumes a large amount of power, and thus, it may have high heat generation characteristics. However, when the second semiconductor chip 270 is disposed at the uppermost portion of the semiconductor package as in the present embodiment, the heat generated may be easily escaped upward. Therefore, such a heat generation problem may be solved. When the logic device 130 is a logic chip, it includes a logic circuit that consumes a large amount of power, and thus, it may have high heat generation characteristics. However, when the logic device 130 is disposed at the uppermost portion of the semiconductor package, for example, when the second semiconductor chip 270 is a logic device 130, the heat generated may be easily escaped upward. Therefore, such a heat generation problem may be solved.

However, when the second semiconductor chip 270 is disposed at the uppermost portion of the semiconductor package, the length of the power supply path (refer to ③' in FIG. 2) from an external component to the second semiconductor chip 270 may increase to cause a problem in which power supply becomes difficult. In order to solve this problem, the magnitude of the voltage input from the external component may be increased, but when the magnitude of the voltage required for the second semiconductor chip 270, for example, the logic chip is smaller than the input voltage, a voltage regulator that lowers the input voltage may be required. In the present embodiment, by implementing the voltage regulator using the bridge die stack 230 and the second redistribution layer 240, power supply to the second semiconductor chip 270 may be performed smoothly while maintaining the area of the semiconductor package or without significantly increasing the area of the semiconductor package. This will be described later. when the logic device 130 is, for example, the second semiconductor chip 270 and is disposed at the uppermost portion of the semiconductor package, the length of the power supply path (refer to ③' in FIG. 2) from an external component to the second semiconductor chip 270 may increase to cause a problem in which power supply becomes difficult. In order to solve this problem, the magnitude of the voltage input from the external component may be increased, but when the magnitude of the voltage required for the logic device 130, for example, the logic chip is smaller than the input voltage, a voltage regulator that lowers the input voltage may be required. In the present embodiment, by implementing the voltage regulator using the bridge die stack 230 and the second redistribution layer 240, power supply to the second semiconductor chip 270, for example, logic device 130 may be performed smoothly while maintaining the area of the semiconductor package or without significantly increasing the area of the semiconductor package. This will be described later.

Further, in the present embodiment, by relatively increasing the width W2 of the second through electrode 234 of the bridge die stack 230, the resistance of the power supply path to the second semiconductor chip 270 may be lowered, and a fusing phenomenon in which the power supply path is cut off due to a high current flow may be prevented. That is, power supply to the second semiconductor chip 270 may be performed more smoothly. As an example, the width W2 of the second through electrode 234 may be greater than the width W1 of the first through electrode 224.

In the semiconductor package described above, the case where the second semiconductor chip 270 is a logic chip or for example a logic device 130 and the first semiconductor chips 220-1, 220-2, 220-3, and 220-4 are memory chips has been described, but the present disclosure is not limited thereto. When, compared to the first semiconductor chips 220-1, 220-2, 220-3, and 220-4, the second semiconductor chip 270 has a larger area in a plan view and consumes more power and/or generates more heat during operation, the present embodiment may be applied.

Meanwhile, the configuration and operation of the voltage regulator will be described with reference to FIGS. 3A to 3D below, and how this voltage regulator is implemented in the semiconductor package of the present embodiment will be described with reference to FIGS. 4 to 7 below.

Figure 3A:
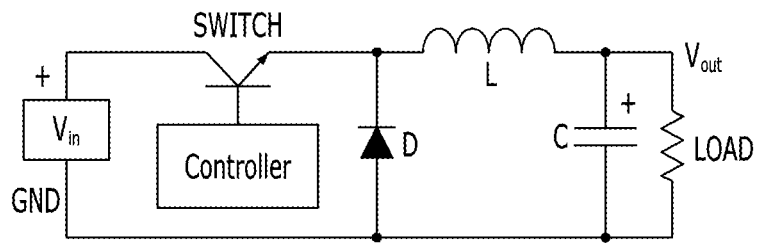
FIG. 3A is a diagram illustrating a voltage regulator according to an embodiment of the present disclosure.

FIG. 3A is a diagram illustrating a voltage regulator according to an embodiment of the present disclosure. FIGS.

Figure 3B:
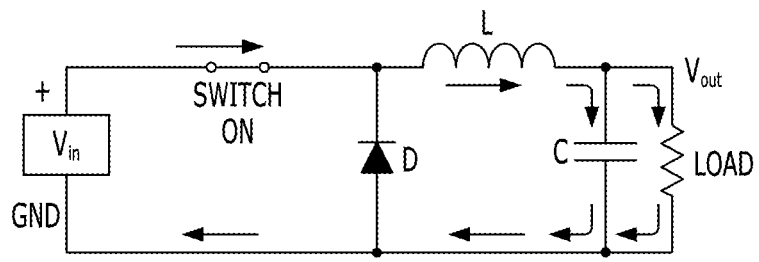
FIGS. 3B and 3C are diagrams illustrating the operation of the voltage regulator of FIG. 3A.
Figure 3C:
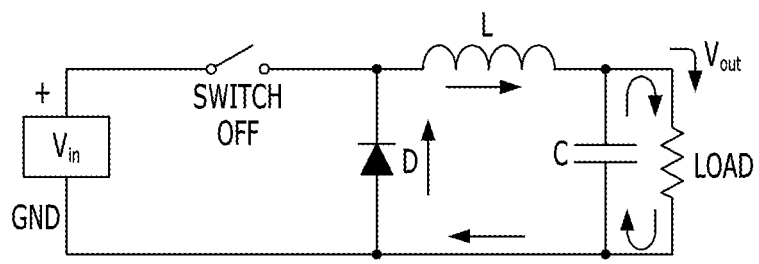
Figure 3D:
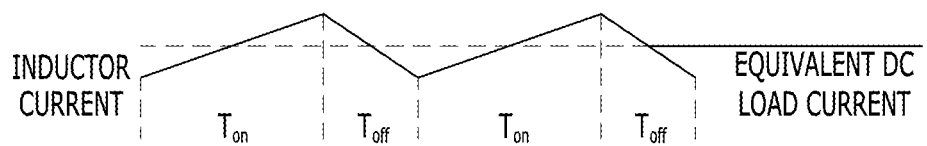
FIG. 3D is a diagram showing a current flowing through an inductor in the on/off states of the switch.

3B and 3C are diagrams illustrating the operation of the voltage regulator of FIG. 3A. In particular, FIG. 3B shows a current flow path (refer to the bold arrow of FIG. 3B) when the switch of FIG. 3A is turned on, and FIG. 3C shows a current flow path (refer to the bold arrow of FIG. 3C) when the switch of FIG. 3A is turned off. FIG. 3D is a diagram showing a current flowing through an inductor in the on/off states of the switch.

Referring to FIG. 3A, the voltage regulator of the present embodiment may include a switch, a controller, a diode D, an inductor L, and a capacitor C.

The controller may be connected to a control terminal of the switch to control the on/off of the switch. The switch may be a three-terminal device having an input terminal connected to an input voltage Vin, an output terminal connected to the inductor L, and the control terminal. For example, the switch may include a transistor. The inductor L may have an input terminal connected to the switch, and an output terminal connected to an output voltage Vout. The diode D may have an output terminal connected between the switch and the inductor L, and an input terminal connected between a ground GND and the output voltage Vout. The capacitor C may have both ends connected between the inductor L and the output voltage Vout, and between the ground GND and the output voltage Vout, respectively.

Referring to FIG. 3B, when the switch is turned on, the input voltage Vin may be connected to the inductor L. At this time, because a reverse current is applied to the diode D, the diode D may be in a turned-off state. Accordingly, the current flowing through the inductor L may increase due to a difference between the input voltage Vin and the output voltage Vout. This is shown in the turned on Ton section of FIG. 3D.

In a state in which the switch is turned on, the current passing through the inductor L may flow to both the capacitor C and the load, and accordingly, the capacitor C may be charged.

Referring to FIG. 3C, when the switch is turned off, the input voltage Vin applied to the inductor L may be removed. Even so, the current of the inductor L might not change immediately. This is because, in a state in which the switch is turned off, a forward current is applied to the diode D so that the diode D is turned on, and accordingly, the current passing through the load and the diode D flows back to the inductor L. In addition, in the state in which the switch is turned off, the capacitor C may be discharged to the load, thereby increasing the total amount of the current flowing through the load. As a result, the current flowing through the inductor L may gradually decrease. This is also well shown in the turned off Toff section of FIG. 3D.

In such a voltage regulator, by appropriately adjusting the on/off time and/or on/off period of the switch to reduce the difference between the peak of the current flowing through the inductor L in the turned on Ton section and the peak of the current flowing through the inductor L in the turned off Toff section as much as possible, the magnitude of the output voltage Vout may be appropriately adjusted. In particular, it may be possible to obtain the output voltage Vout that is reduced by a predetermined degree compared to the input voltage Vin. The word "predetermined" as used herein with respect to a parameter, such as a predetermined degree, predetermined depth, predetermined angle, predetermined voltage, etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 4:
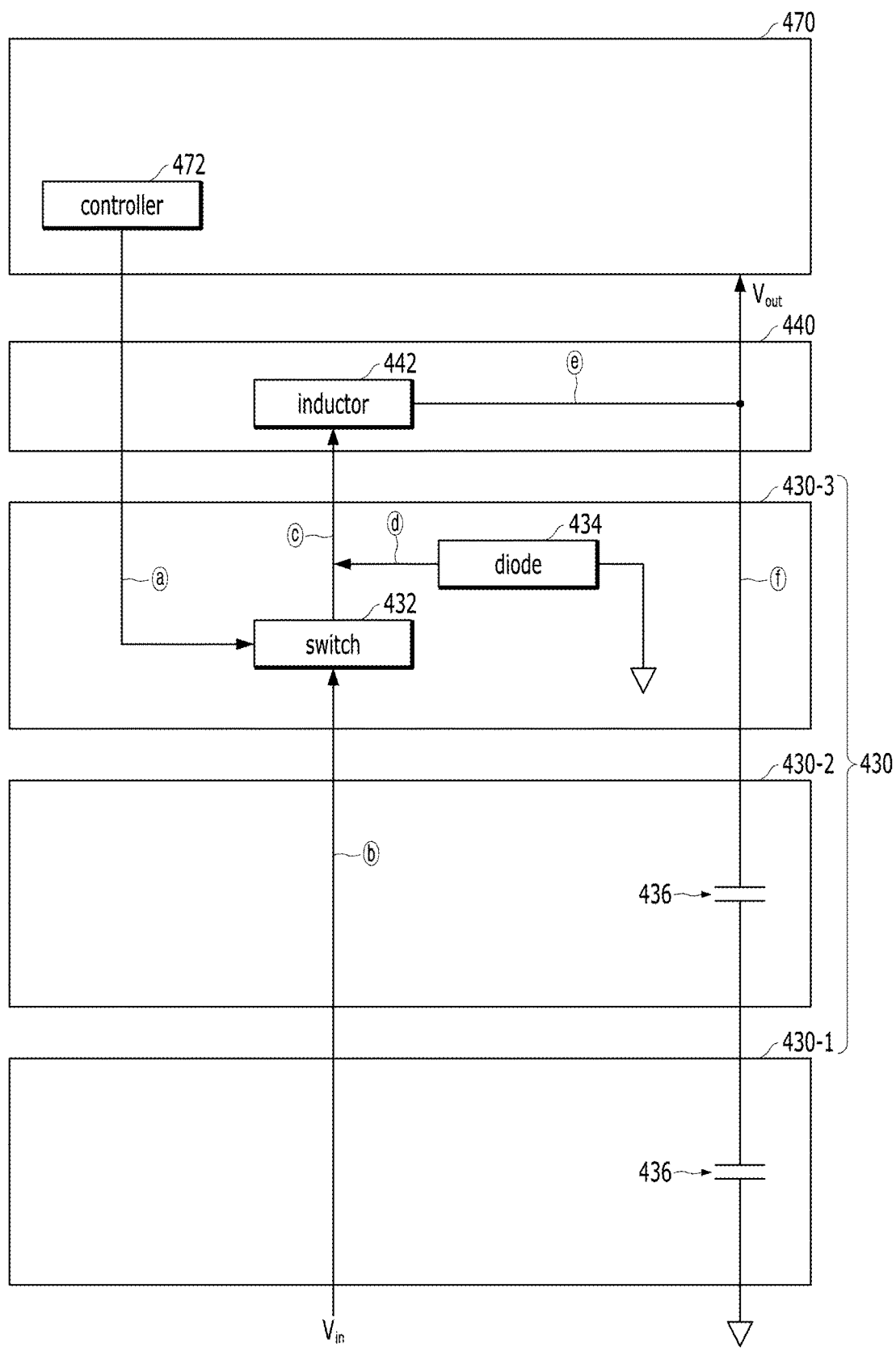
FIG. 4 is a schematic block diagram of a semiconductor package according to another embodiment of the present disclosure.

FIG. 4 is a schematic block diagram of a semiconductor package according to another embodiment of the present disclosure. FIG. 4 schematically shows how the voltage regulator of FIG. 3A is implemented in the semiconductor package of FIG. 2, particularly in the bridge die stack, the second redistribution layer, and the second semiconductor chip of FIG. 2. For convenience of description, only portions of the semiconductor package of FIG. 2 corresponding to the bridge die stack, the second redistribution layer, and the second semiconductor chip are illustrated in FIG. 4.

Referring to FIG. 4, the semiconductor package of the present embodiment may include a bridge die stack 430, a second redistribution layer 440, and a second semiconductor chip 470 that are sequentially stacked in a vertical direction. In this case, the bridge die stack 430 may include a plurality of bridge dies 430-1, 430-2, and 430-3 stacked in the vertical direction. In the present embodiment, a case in which three bridge dies 430-1, 430-2, and 430-3 are stacked is illustrated, but the present disclosure is not limited thereto, and the number of bridge dies stacked in the vertical direction may be variously modified.

In this case, a voltage regulator may include a switch 432, a diode 434, and a capacitor 436 that are formed in the bridge die stack 430, an inductor 442 that is formed in the second redistribution layer 440, and a controller 472 that is formed in the second semiconductor chip 470.

The controller 472 may be electrically connected to a control terminal of the switch 432 to control on/off of the switch 432. The shorter the electrical connection path between the controller 472 and the switch 432 is, the quicker the controller 472 controls the switch 432. To this end, the switch 432 may be formed in the uppermost bridge die 430-3 of the bridge die stack 430, which is closest to the second semiconductor chip 470. However, the present disclosure is not limited thereto, and the switch 432 may be formed in one of the plurality of bridge dies 430-1, 430-2, and 430-3.

The electrical path between the controller 472 and the control terminal of the switch 432 is indicated by arrow ⓐ. Although not shown, this electrical path ⓐ may be implemented through a connection electrode between the second semiconductor chip 470 and the second redistribution layer 440, a wiring structure in the second redistribution layer 440, a connection electrode between the uppermost bridge die 430-3 and the second redistribution layer 440, and a wiring structure in the uppermost bridge die 430-3.

An input terminal of the switch 432 may be connected to an external component (not shown) to receive power, that is, an input voltage Vin. The electrical path between the input terminal of the switch 432 and the external component is indicated by an arrow ⓑ. Although not shown, the electrical path ⓑ may be implemented by a stacked structure of through electrodes and connection electrodes connecting the plurality of bridge dies 430-1, 430-2, and 430-3.

An output terminal of the switch 432 may be connected to the inductor 442 to transmit a voltage supplied to the switch 432. The electrical path between the output terminal of the switch 432 and the inductor 442 is indicated by an arrow ⓒ. Although not shown, this electrical path ⓒ may be implemented by a wiring structure in the uppermost bridge die 430-3, a connection electrode between the second redistribution layer 440 and the uppermost bridge die 430-3, a wiring structure in the second redistribution layer 440.

The diode 434 may be formed together with the switch 432 in the same bridge die in which the switch 432 is formed. For example, the diode 434 may be formed in the uppermost bridge die 430-3. This is because the area occupied by the switch 432 and the diode 434 is small, so that the formation of the switch 432 and the diode 434 in one bridge die is facilitated, and the electrical path between the switch 432 and the diode 434 is shortened.

An output terminal of the diode 434 may be connected to the electrical path ⓒ. That is, the diode 434 may have the output terminal connected between the output terminal of the switch 432 and an input terminal of the inductor 442. The electrical path connected to the output terminal of the diode 434 is indicated by arrow ⓓ. Although not shown, this electrical path ⓓ may be implemented through a wiring structure in the uppermost bridge die 430-3. An input terminal of the diode 434 may be electrically connected to a ground.

The inductor 442 may be formed in the second redistribution layer 440. This is because the area occupied by the inductor 442 is relatively large compared to the switch 432, the diode 434, the capacitor 436, or the like. The input terminal of the inductor 442 may be connected to the output terminal of the switch 432 through the electrical path ⓒ as described above. An output terminal of the inductor 442 may be connected to the second semiconductor chip 470, and accordingly, power adjusted by the voltage regulator, that is, the output voltage Vout, may be supplied to the second semiconductor chip 470. The electrical path between the output terminal of the inductor 442 and the second semiconductor chip 470 is indicated by an arrow ⓔ. Although not shown, the electrical path ⓔ may be implemented through a wiring structure in the second redistribution layer 440, and a connection electrode between the second redistribution layer 440 and the second semiconductor chip 470.

The capacitor 436 may be formed in the remaining bridge dies 430-1 and 430-2, except for the uppermost bridge die 430-3 of the bridge die stack 430. The reason that the capacitor 436 is not formed in the uppermost bridge die 430-3 may be to increase the capacitance of the capacitor 436 by securing a sufficient area for the formation of the capacitor 436. If the capacitor 436 is formed in the uppermost bridge die 430-3 in which the switch 432 and the diode 434 are formed, the formation area of the capacitor 436 might not be sufficient. In addition, the reason that the capacitor 436 is formed in all of the remaining bridge dies 430-1 and 430-2, except for the uppermost bridge die 430-3, may be to further increase the capacitance of the capacitor 436. However, the present disclosure is not limited thereto. In another embodiment, the capacitor 436 may be formed in the uppermost bridge die 430-3. Alternatively, the capacitor 436 may be formed in one of the remaining bridge dies 410-1 and 410-2.

One end of the capacitor 436 may be connected to the second semiconductor chip 470, that is, the output voltage Vout. An electrical path connected to the one end of the capacitor 436 is indicated by an arrow ⓕ. Although not shown, this electrical path ⓕ may be implemented through a stacked structure of through electrodes and connection electrodes connecting the plurality of bridge dies 430-1, 430-2, and 430-3, a connection electrode between the uppermost bridge die 430-3 and the second redistribution layer 440, a wiring structure of the second redistribution layer 440, and a connection electrode between the second redistribution layer 440 and the second semiconductor chip 470. The other end of the capacitor 436 may be electrically connected to the ground.

Accordingly, the voltage regulator described in FIG. 3A may be implemented in the semiconductor package of the present embodiment.

Figure 5:
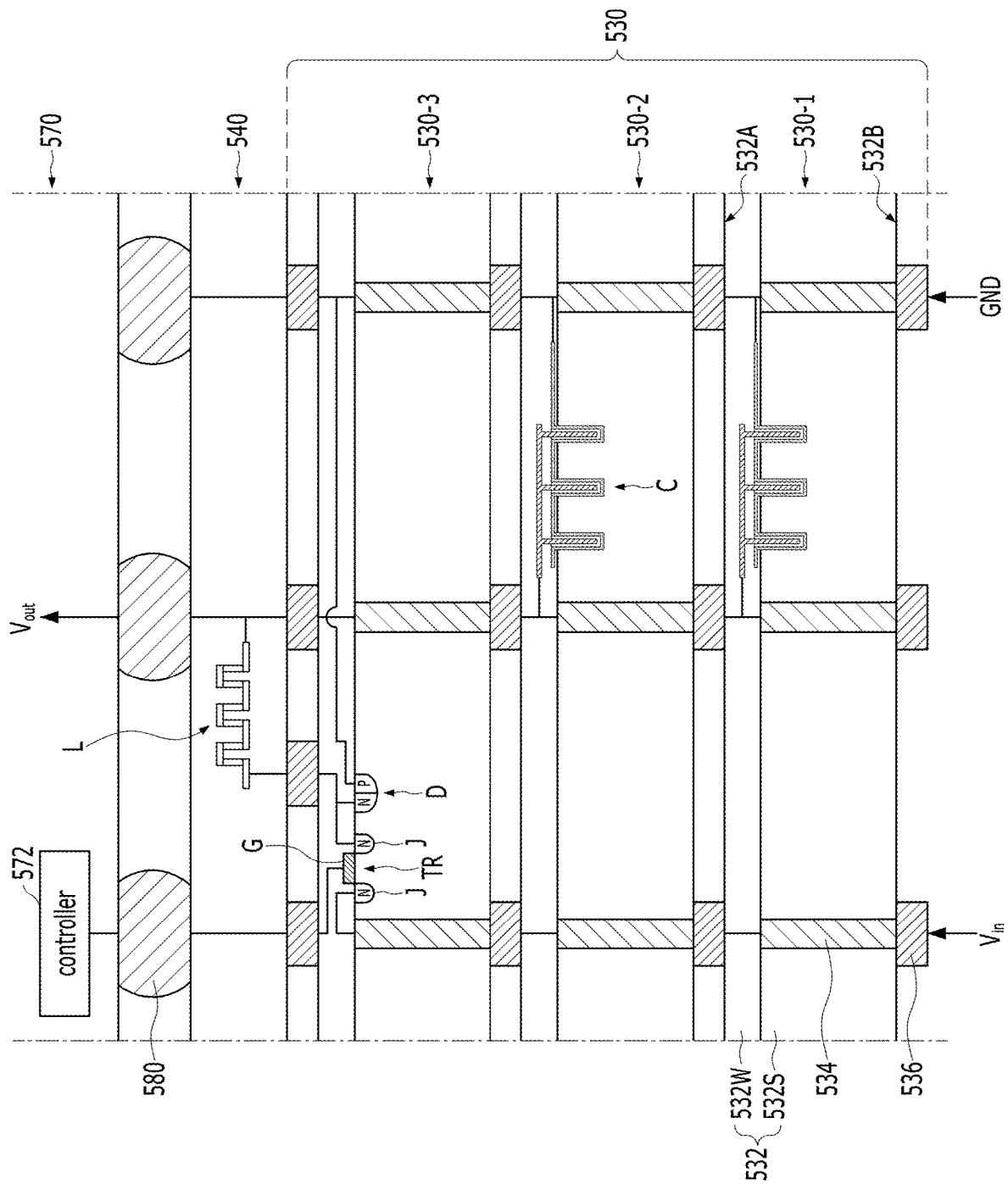
FIG. 5 is a diagram illustrating a semiconductor package according to another embodiment of the present disclosure.

FIG. 5 is a more detailed diagram illustrating a semiconductor package according to another embodiment of the present disclosure. In FIG. 4 described above, the components of the voltage regulator and the electrical connections therebetween are briefly shown in boxes and lines. On the other hand, in FIG. 5, an example in which the components of the voltage regulator and the electrical connections therebetween are specifically implemented, is shown.

Referring to FIG. 5, the semiconductor package of the present embodiment may include a bridge die stack 530, a second redistribution layer 540, and a second semiconductor chip 570 that are sequentially stacked in a vertical direction. The bridge die stack 530, the second redistribution layer 540, and the second semiconductor chip 570 may substantially correspond to the bridge die stack 430, the second redistribution layer 440, and the second semiconductor chip 470 of FIG. 4, respectively.

The bridge die stack 530 may include a plurality of bridge dies 530-1, 530-2, and 530-3 that are stacked in the vertical direction, and a second connection electrode 536 connecting them to each other. Each of the plurality of bridge dies 530-1, 530-2, and 530-3 may include a second body portion 532 and a second through electrode 534.

The second body portion 532 may have one surface 532A and the other surface 532B. The second body portion 532 may include a semiconductor body 532S and a wiring portion 532W disposed over the semiconductor body 532S. The wiring portion 532W may be disposed adjacent to the one surface 532A of the second body portion 532. The wiring structure in the wiring portion 532W is schematically illustrated by lines, except for a transistor TR, a diode D, and a capacitor C to be described later.

The second through electrode 534 may be formed to penetrate the semiconductor body 532S. One end of the second through electrode 534 may be connected to the wiring portion 532W, and may be electrically connected to the second connection electrode 536 located over the second through electrode 534 through the wiring portion 532W. On the other hand, the other end of the second through electrode 534 may directly contact the second connection electrode 536 located under the second through electrode 534.

The second through electrode 534 and the second connection electrode 536 that are electrically connected to each other while being aligned with each other in the vertical direction may perform the same function. In the present embodiment, the stacked structure of the second through electrode 534 and the second connection electrode 536 positioned at the leftmost side may be connected to an input voltage Vin, the stacked structure of the second through electrode 534 and the second connection electrode 536 positioned at the rightmost side may be connected to a ground GND, and the stacked structure of the second through electrode 534 and the second connection electrode 536 therebetween may be connected to an output voltage Vout.

The second redistribution layer 540 may be disposed over the bridge die stack 530, and may be electrically connected to the bridge die stack 530 through the second connection electrode 536 that is disposed between the uppermost bridge die 530-3 and the second redistribution layer 540. The wiring structure in the second redistribution layer 540 is schematically illustrated by lines, except for the inductor L to be described later.

The second semiconductor chip 570 may be disposed over the second redistribution layer 540, and may be electrically connected to the second redistribution layer 540 through the second external connection electrode 580 that is disposed between the second redistribution layer 540 and the second semiconductor chip 570. The detailed configuration of the second semiconductor chip 570 is omitted, except for the controller 572 to be described later.

Here, the transistor TR corresponding to the switch of the voltage regulator may be formed in one of the plurality of bridge dies 530-1, 530-2, and 530-3. For example, the transistor TR may be formed in the uppermost bridge die 530-3. More specifically, the transistor TR may include a gate G formed over the semiconductor body 532S, and junction regions J formed in the semiconductor body 532S at both sides of the gate G. The gate G may correspond to a control terminal of the switch, and both junction regions J may correspond to an input terminal and an output terminal of the switch, respectively.

The gate G may be a part of the wiring structure of the wiring portion 532W. The gate G may be connected to the controller 572 through the wiring structure of the wiring portion 532W, the second connection electrode 536, the wiring structure of the second redistribution layer 540, and the second external connection electrode 580. Accordingly, the controller 572 may control on/off of the transistor TR by applying a predetermined voltage to the gate G.

Among both junction regions J, the junction region J corresponding to the input terminal of the transistor TR, for example, the junction region J on the left, may be connected to the stacked structure of the second through electrode 534 and the second connection electrode 536 that is connected to the input voltage Vin, through the wiring structure of the wiring portion 532W connected thereto.

Among both junction regions J, the junction region J corresponding to the output terminal of the transistor TR, for example, the junction region J on the right, may be connected to the input terminal of the inductor L through the wiring structure of the wiring portion 532W connected thereto, the second connection electrode 536, and the wiring structure of the second redistribution layer 540.

The diode D may be implemented by two junction regions that are formed in the semiconductor body 532S and have different conductivity types. One of the two junction regions, for example, the N-type junction region, may correspond to the output terminal of the diode D, and may be connected to a wiring structure between the junction region J corresponding to the output terminal of the transistor TR and the second connection electrode 536, through the wiring structure of the wiring portion 532W connected thereto. The other of the two junction regions, for example, the P-type junction region, may correspond to the input terminal of the diode D, and may be connected to the stacked structure of the second through electrode 534 and the second connection electrode 536 that is connected to the ground GND, through the wiring structure of the wiring portion 532W connected thereto.

The inductor L may be formed in the second redistribution layer 540. As described above, the input terminal of the inductor L may be connected to the junction region J corresponding to the output terminal of the transistor TR, for example, the junction region J on the right, through the wiring structure connected thereto, the second connection electrode 536, and the wiring structure of the wiring portion 532W of the uppermost bridge die 530-3. The output terminal of the inductor L may be connected to the second semiconductor chip 570 through the wiring structure connected thereto and the second external connection electrode 580, so as to supply the output voltage Vout to the second semiconductor chip 570. Further, the output terminal of the inductor L may be connected to the stacked structure of the second through electrode 534 and the second connection electrode 536. That is, the stacked structure of the second through electrode 534 and the second connection electrode 536 that is connected to the output voltage Vout may exist. The specific shape of the inductor L is shown, for example in FIG. 6 but is not limited to what is shown in FIG. 6.

Figure 6:
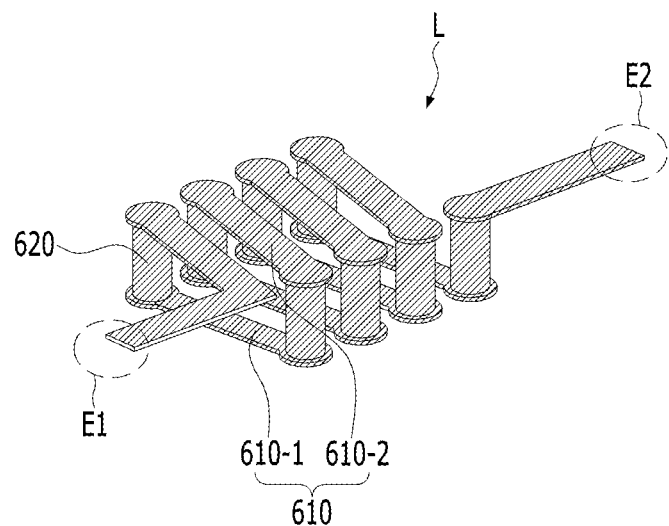
FIG. 6 is a perspective view illustrating an example of the inductor of FIG. 5.

FIG. 6 is a perspective view illustrating an example of the inductor of FIG. 5.

Referring to FIG. 6, the inductor L may include a conductive line 610 and a conductive via 620. The conductive line 610 may include a first conductive line 610-1 and a second conductive line 610-2 that are positioned at different layers in the vertical direction.

A plurality of first conductive lines 610-1 may be arranged parallel to each other, and a plurality of second conductive lines 610-2 may cross the plurality of first conductive lines 610-1 at a predetermined angle while being arranged in parallel to each other. One end portion of one of the plurality of first conductive lines 610-1 may overlap one end portion of a corresponding second conductive line 610-2, and may be connected thereto by the conductive via 620. The other end portion of the one of the plurality of first conductive lines 610-1 may overlap one end portion of another second conductive line 610-2 adjacent to the corresponding second conductive line 610-2, and may be connected thereto by the conductive via 620. Accordingly, the plurality of first conductive lines 610-1 and the plurality of second conductive lines 610-2 may be connected to each other in a chain shape.

Both end portions E1 and E2 of the inductor L may be positioned to extend from the first conductive line 610-1 and/or the second conductive line 610-2. The both end portions E1 and E2 of the inductor L may be connected to the wiring structure of the second redistribution layer 540 of FIG. 5 described above.

Although not shown, the conductive line 610 and the conductive via 620 forming the inductor L may be molded with an insulating material. Furthermore, a material having a high permeability compared to the insulating material may be interposed between the first conductive line 610-1 and the second conductive line 610-2.

Referring back to FIG. 5, the capacitor C may be formed in each of the remaining bridge dies 530-1 and 530-2 of the bridge die stack 530, except for the uppermost bridge die 530-3. One end of the capacitor C may be connected to the stacked structure of the second through electrode 534 and the second connection electrode 536 that is connected to the output voltage Vout, through the wiring structure of the wiring portion 532W connected thereto. The other end of the capacitor C may be connected to the stacked structure of the second through electrode 534 and the second connection electrode 536 that is connected to the ground GND, through the wiring structure of the wiring portion 532W connected thereto. The specific shape of the capacitor C is shown, for example in FIG. 7 but is not limited to what is shown in FIG. 7.

Figure 7:
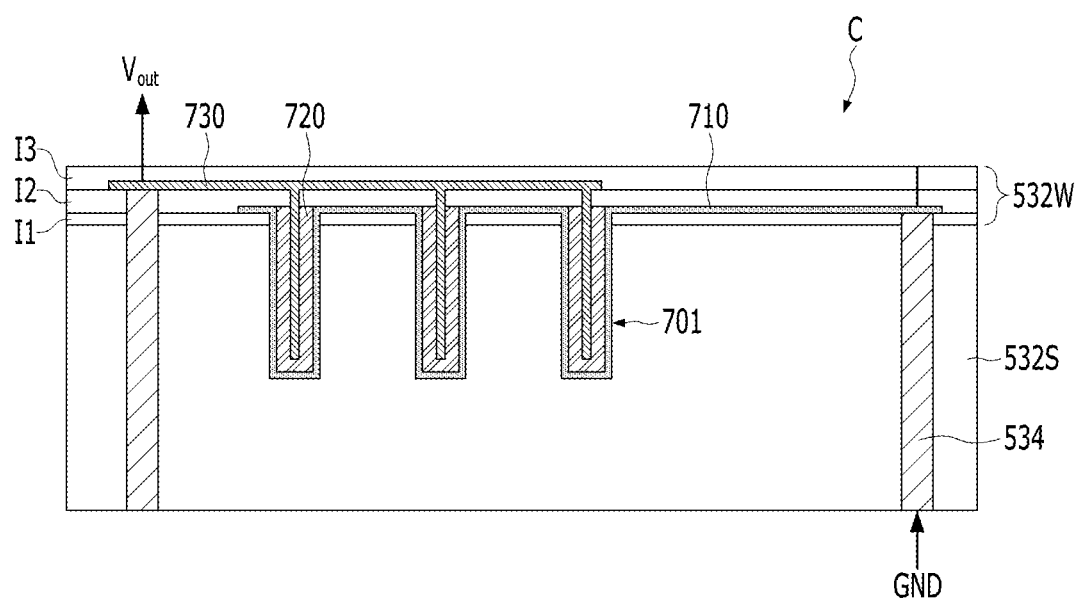
FIG. 7 is a cross-sectional view illustrating an example of the capacitor of FIG. 5.

FIG. 7 is a cross-sectional view illustrating an example of the capacitor of FIG. 5.

Referring to FIG. 7, the capacitor C may include a first electrode 710, a second electrode 730, and a dielectric layer 720 interposed between the first electrode 710 and the second electrode 730. In particular, the capacitor C may correspond to a trench-type capacitor in which the first electrode 710, the second electrode 730, and the dielectric layer 720 are formed along a trench 701 formed in the semiconductor body 532S.

More specifically, the wiring portion 532W disposed over the semiconductor body 532S may include first to third insulating layers I1, I2, and I3. The trench 701 may be formed to a predetermined depth in the first insulating layer I1 and the semiconductor body 532S. The trench 701 may be positioned between the second through electrode 534 connected to the output voltage Vout and the second through electrode 534 connected to the ground GND in the horizontal direction. One or more trenches 701 may be formed.

The first electrode 710 may have a thin thickness that does not completely fill the trench 701, and may be conformally formed along the surface of the trench 701 and the upper surface of the first insulating layer I1. The first electrode 710 may be connected to one end of the second through electrode 534 that is connected to the ground GND.

The dielectric layer 720 may have a thin thickness that does not completely fill the trench 701 in which the first electrode 710 is formed, and may be formed over the first electrode 710 to be positioned inside each of the plurality of trenches 701.

The second electrode 730 may be formed to penetrate the second insulating layer I2 and extend onto the upper surface of the second insulating layer I2 while completely filling the remaining space of the trench 701 in which the first electrode 710 and the dielectric layer 720 are formed. The second electrode 730 may be connected to one end of the second through electrode 534 that is connected to the output voltage Vout.

In the present embodiment, a trench-type capacitor is illustrated, but the present disclosure is not limited thereto, and capacitors of various shapes in which a dielectric layer is interposed between two electrodes may be implemented.

Referring back to FIG. 5, as a result, the voltage regulator including the transistor TR, the diode D, the capacitor C, the inductor L, and the controller 572 may be implemented in the semiconductor package of the present embodiment.

According to the semiconductor package described above, the voltage regulator may be implemented without increasing the area of the bridge dies 530-1, 530-2, and 530-3 or the area of the second redistribution layer 540. As a result, smooth power supply to the second semiconductor chip 570 may be possible.

According to the above embodiments of the present disclosure, it may be possible to provide a semiconductor package capable of improving heat dissipation characteristics and supplying a stable voltage while satisfying the demand for high performance/high capacity.

Figure 8:
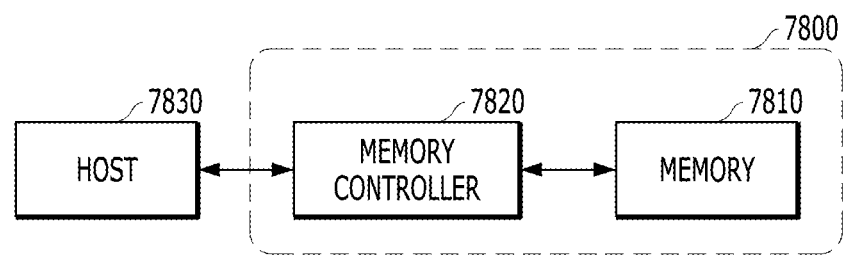
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
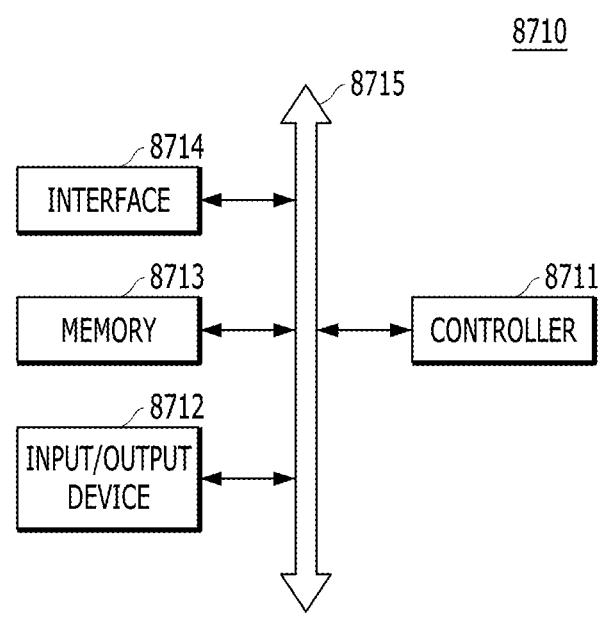
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:
1. A semiconductor package comprising:
a first semiconductor chip stack including a plurality of first semiconductor chips which are stacked in a vertical direction;
a bridge die stack disposed to be spaced apart from the first semiconductor chip stack in a horizontal direction and including a plurality of bridge dies which are stacked in the vertical direction, wherein the bridge dies include through electrodes, respectively, and the through electrodes aligned in the vertical direction are connected to each other through a connection electrode between the bridge dies;
a redistribution layer disposed over the first semiconductor chip stack and the bridge die stack;

a second semiconductor chip disposed over the redistribution layer and configured to receive a voltage through the through electrodes aligned in the vertical direction, the connection electrode, and the redistribution layer; and a voltage regulator configured to adjust the voltage, wherein the voltage regulator comprises:
   a switch included in at least one of the bridge dies;
   a diode included in at least one of the bridge dies;
   a capacitor included in at least one of the bridge dies;
   an inductor included in the redistribution layer; and
   a controller included in the second semiconductor chip.

2. The semiconductor package according to claim 1, wherein each of the bridge dies includes a semiconductor body and a wiring portion disposed over the semiconductor body, and
   wherein the through electrode passes through the semiconductor body and is electrically connected to the wiring portion.

3. The semiconductor package according to claim 2, wherein the switch includes a transistor which includes a gate formed over the semiconductor body and junction regions formed in the semiconductor body at both sides of the gate.

4. The semiconductor package according to claim 3, wherein the gate is connected to the controller through the wiring portion and the redistribution layer,
   wherein the junction region at one side of the both sides of the gate is connected to one end of the through electrode which is disposed in the bridge die in which the switch is formed and is connected to an input voltage, through the wiring portion, and
   wherein the junction region at an other side of the both sides of the gate is connected to the inductor through the wiring portion and the redistribution layer.

5. The semiconductor package according to claim 3, wherein the diode includes junction regions that are formed in the semiconductor body of the bridge die in which the switch is formed and the junction regions have different conductivity types.

6. The semiconductor package according to claim 5, wherein one of the junction regions of the diode is connected between the junction region at an other side of the both sides of the gate and the inductor, through the wiring portion, and
   wherein an other one of the junction regions of the diode is connected to one end of the through electrode which is disposed in the bridge die in which the switch is formed and is connected to a ground, through the wiring portion.

7. The semiconductor package according to claim 2, wherein the capacitor includes a first electrode, a second electrode, and a dielectric layer between the first electrode and the second electrode,
   wherein the first electrode is connected to the through electrode which is disposed in the bridge die in which the capacitor is formed and is connected to an output voltage, and
   wherein the second electrode is connected to the through electrode which is disposed in the bridge die in which the capacitor is formed and is connected to a ground.

8. The semiconductor package according to claim 7, wherein the first electrode, the second electrode, and the dielectric layer are formed along a trench formed in the semiconductor body.

9. The semiconductor package according to claim 1, wherein the inductor comprises:

a plurality of first conductive lines substantially parallel to each other;
a plurality of second conductive lines disposed over the first conductive lines and crossing the first conductive lines to be substantially parallel to each other; and
a conductive via connecting the first conductive line and the second conductive line in an overlapping region between the first conductive line and the second conductive line, and
wherein both end portions of the first conductive line overlap one end portion of one second conductive line and an other end portion of another second conductive line adjacent to the one second conductive line, respectively.

10. The semiconductor package according to claim 1, wherein the through electrode includes a first through electrode connected to an input voltage, a second through electrode connected to an output voltage, and a third through electrode connected to a ground, and
   wherein, in the horizontal direction, the second through electrode is disposed between the first through electrode and the third through electrode.

11. The semiconductor package according to claim 1, wherein the switch and the diode are formed in a first bridge die among the bridge dies, and
   wherein the capacitor is formed in one or more remaining bridge dies among the bridge dies, except for the first bridge die.

12. The semiconductor package according to claim 11, wherein the remaining bridge dies include two or more bridge dies, and
   wherein the capacitor is formed in each of the two or more bridge dies.

13. The semiconductor package according to claim 11, the first bridge die is located over the remaining bridge dies.

14. The semiconductor package according to claim 1, wherein the first semiconductor chip includes a memory chip, and
   wherein the second semiconductor chip includes a logic chip.

15. A semiconductor package comprising:
   a first semiconductor chip stack including a plurality of first semiconductor chips which are stacked in a vertical direction;
   a bridge die stack disposed to be spaced apart from the first semiconductor chip stack in a horizontal direction and including a plurality of bridge dies which are stacked in the vertical direction;
   a redistribution layer disposed over the first semiconductor chip stack and the bridge die stack;
   a second semiconductor chip disposed over the redistribution layer and configured to receive a voltage through the bridge die stack and the redistribution layer; and
   a voltage regulator configured to adjust the voltage, wherein the voltage regulator comprises:
      a switch included in at least one of the bridge dies;
      a diode included in at least one of the bridge dies;
      a capacitor included in at least one of the bridge dies;
      an inductor included in the redistribution layer; and
      a controller formed in the second semiconductor chip.

16. The semiconductor package according to claim 15, wherein a control terminal, an input terminal, and an output terminal of the switch are respectively connected to the controller, an input voltage, and an input terminal of the inductor, wherein an output terminal of the inductor is connected to the second semiconductor chip, wherein an input terminal of the diode is connected to a ground, and an output terminal of the diode is connected between the output terminal of the switch and the input terminal of the inductor, and wherein one end and an other end of the capacitor are respectively connected to the second semiconductor chip and the ground.

17. The semiconductor package according to claim 15, wherein the switch and the diode are formed in a first bridge die among the bridge dies, and wherein the capacitor is formed in one or more remaining bridge dies among the bridge dies, except for the first bridge die.

18. The semiconductor package according to claim 17, wherein the remaining bridge dies include two or more bridge dies, and wherein the capacitor is formed in each of the two or more bridge dies.

19. The semiconductor package according to claim 17, wherein the first bridge die is located over the remaining bridge dies.

20. The semiconductor package according to claim 15, wherein the first semiconductor chip includes a memory chip, and wherein the second semiconductor chip includes a logic chip.

* * * * *